(12) United States Patent
Yoshimizu

(10) Patent No.: US 10,192,882 B1
(45) Date of Patent: Jan. 29, 2019

(54) SEMICONDUCTOR DEVICE AND METHOD FOR MANUFACTURING SAME

(71) Applicant: Toshiba Memory Corporation, Minato-ku (JP)

(72) Inventor: Yasuhito Yoshimizu, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/838,427

(22) Filed: Dec. 12, 2017

(30) Foreign Application Priority Data

Sep. 12, 2017 (JP) .................................. 2017-174687

(51) Int. Cl.

| H01L 27/11582 | (2017.01) |
|---|---|
| H01L 29/10 | (2006.01) |
| H01L 23/532 | (2006.01) |
| H01L 21/768 | (2006.01) |
| H01L 21/311 | (2006.01) |
| H01L 21/3213 | (2006.01) |
| H01L 27/11556 | (2017.01) |
| H01L 23/528 | (2006.01) |
| H01L 21/02 | (2006.01) |
| H01L 21/28 | (2006.01) |

(52) U.S. Cl.
CPC ... *H01L 27/11582* (2013.01); *H01L 21/31111* (2013.01); *H01L 21/32134* (2013.01); *H01L 21/7682* (2013.01); *H01L 21/76877* (2013.01); *H01L 23/528* (2013.01); *H01L 23/53266* (2013.01); *H01L 23/53295* (2013.01); *H01L 27/11556* (2013.01); *H01L 29/1037* (2013.01); *H01L 21/02636* (2013.01); *H01L 21/28273* (2013.01); *H01L 21/28282* (2013.01)

(58) Field of Classification Search
CPC ......... H01L 27/11582; H01L 21/76877; H01L 29/1037; H01L 23/528; H01L 27/11556; H01L 21/32134; H01L 23/53295; H01L 21/31111; H01L 21/7682; H01L 23/53266; H01L 21/28273; H01L 21/28282; H01L 21/02636
See application file for complete search history.

(56) References Cited

U.S. PATENT DOCUMENTS

| 8,912,591 B2 | 12/2014 | Baek et al. |
| 9,576,975 B2 | 2/2017 | Zhang et al. |

(Continued)

FOREIGN PATENT DOCUMENTS

JP  2017-045825  3/2017

*Primary Examiner* — David Vu
(74) *Attorney, Agent, or Firm* — Oblon, McClelland, Maier & Neustadt, L.L.P.

(57) ABSTRACT

According to one embodiment, a semiconductor device includes a stacked body, a columnar portion, and a first air gap. The stacked body includes a plurality of conductive layers stacked with an insulator interposed. The columnar portion extends through the stacked body in a stacking direction of the stacked body. The first air gap extends through the stacked body in the stacking direction. The insulator includes an insulating layer provided at a periphery of a side surface of the columnar portion, and a second air gap communicating with the first air gap and being provided between the insulating layer and the first air gap. The insulating layer has a protrusion at an end adjacent to the second air gap.

14 Claims, 19 Drawing Sheets

(56) References Cited

U.S. PATENT DOCUMENTS

2011/0298013 A1* 12/2011 Hwang ............. H01L 27/11551
                                                            257/208
2017/0047341 A1    2/2017  Arai
2017/0062459 A1    3/2017  Yoshimizu et al.
2017/0069652 A1    3/2017  Arai

* cited by examiner

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2017-174687, filed on Sep. 12, 2017; the entire contents of which are incorporated herein by reference.

FIELD

Embodiments described herein relate generally to a semiconductor device and a method for manufacturing a semiconductor device.

BACKGROUND

In a three-dimensional memory device having multiple conductive layers stacked on a substrate, a structure has been proposed in which an air gap is provided between the conductive layers adjacent to each other above and below. Such a structure may decrease a mechanical strength. Therefore, a structure has been proposed in which an air gap is provided in a portion of the region between the conductive layers adjacent to each other above and below while causing an insulating layer to remain between the conductive layers.

DETAILED DESCRIPTION

Figure 1:
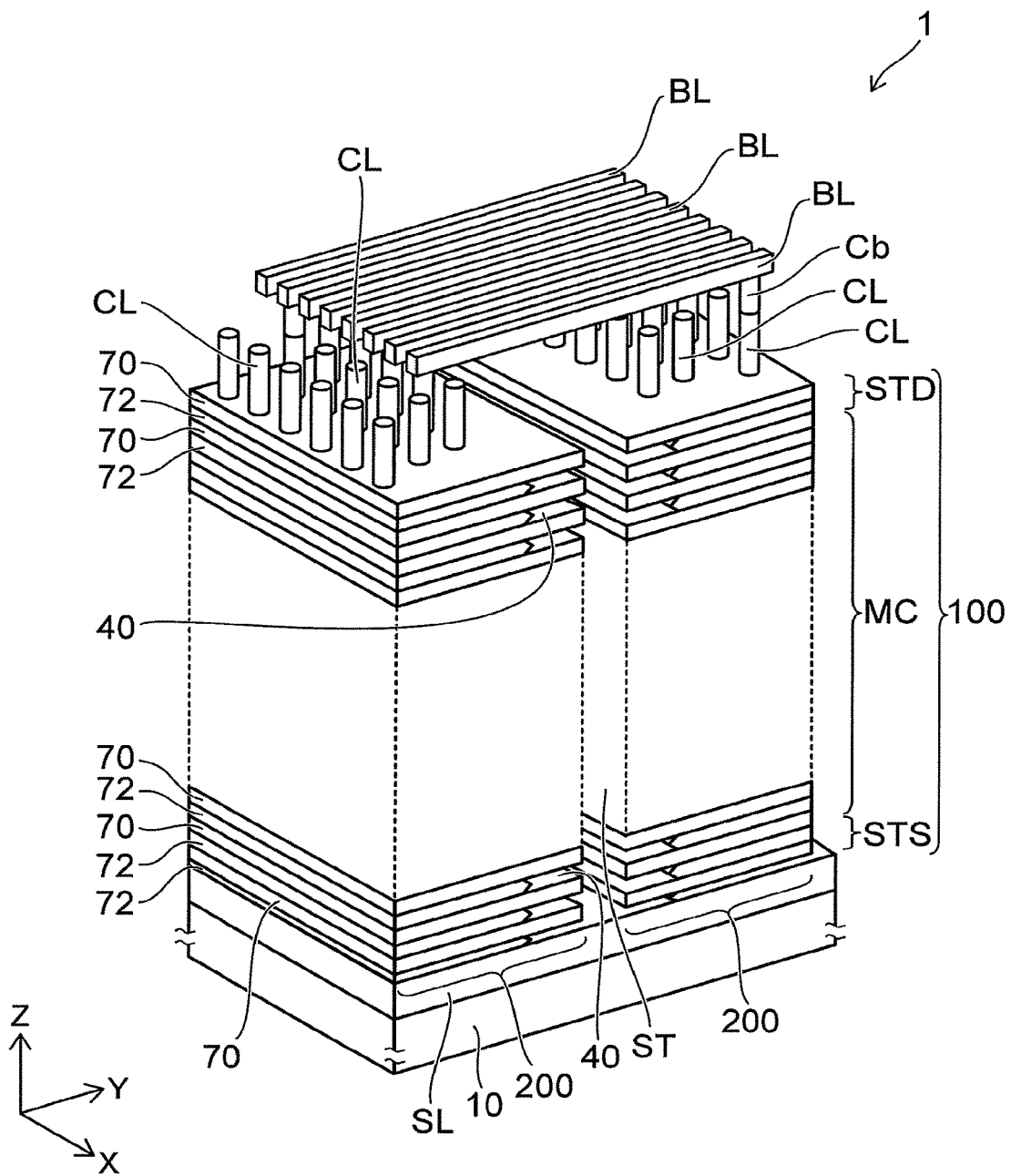
FIG. 1 is a schematic perspective view of a semiconductor device of an embodiment.

According to one embodiment, a semiconductor device includes a stacked body, a columnar portion, and a first air gap. The stacked body includes a plurality of conductive layers stacked with an insulator interposed. The columnar portion extends through the stacked body in a stacking direction of the stacked body. The first air gap extends through the stacked body in the stacking direction. The insulator includes an insulating layer provided at a periphery of a side surface of the columnar portion, and a second air gap communicating with the first air gap and being provided between the insulating layer and the first air gap. The insulating layer has a protrusion at an end adjacent to the second air gap.

Embodiments will now be described with reference to the drawings. The same components in the drawings are marked with the same reference numerals.

In the embodiment, for example, a semiconductor memory device that includes a memory cell array having a three-dimensional structure is described as the semiconductor device.

FIG. 1 is a schematic perspective view of the memory cell array 1 of the embodiment.

Figure 2:
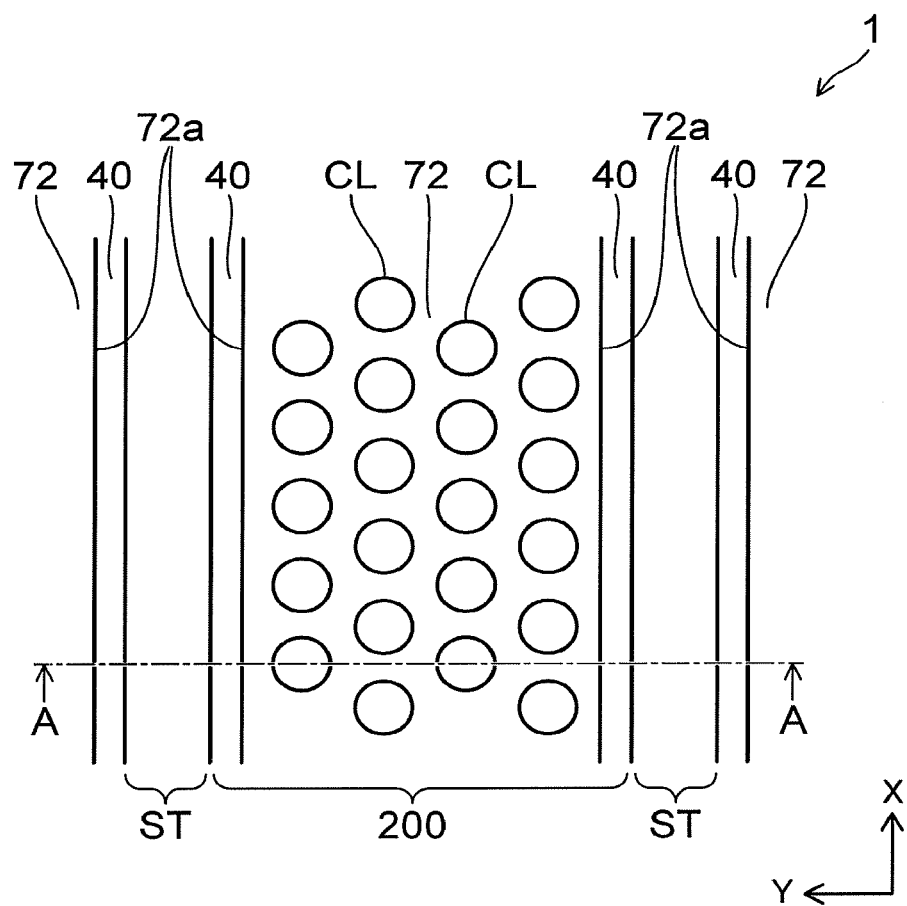
FIG. 2 is a schematic view showing a planar layout of the semiconductor device of the embodiment.

FIG. 2 is a schematic view showing a planar layout of a layer of the memory cell array 1 of the embodiment in which an insulating layer 72 is provided.

Figure 3:
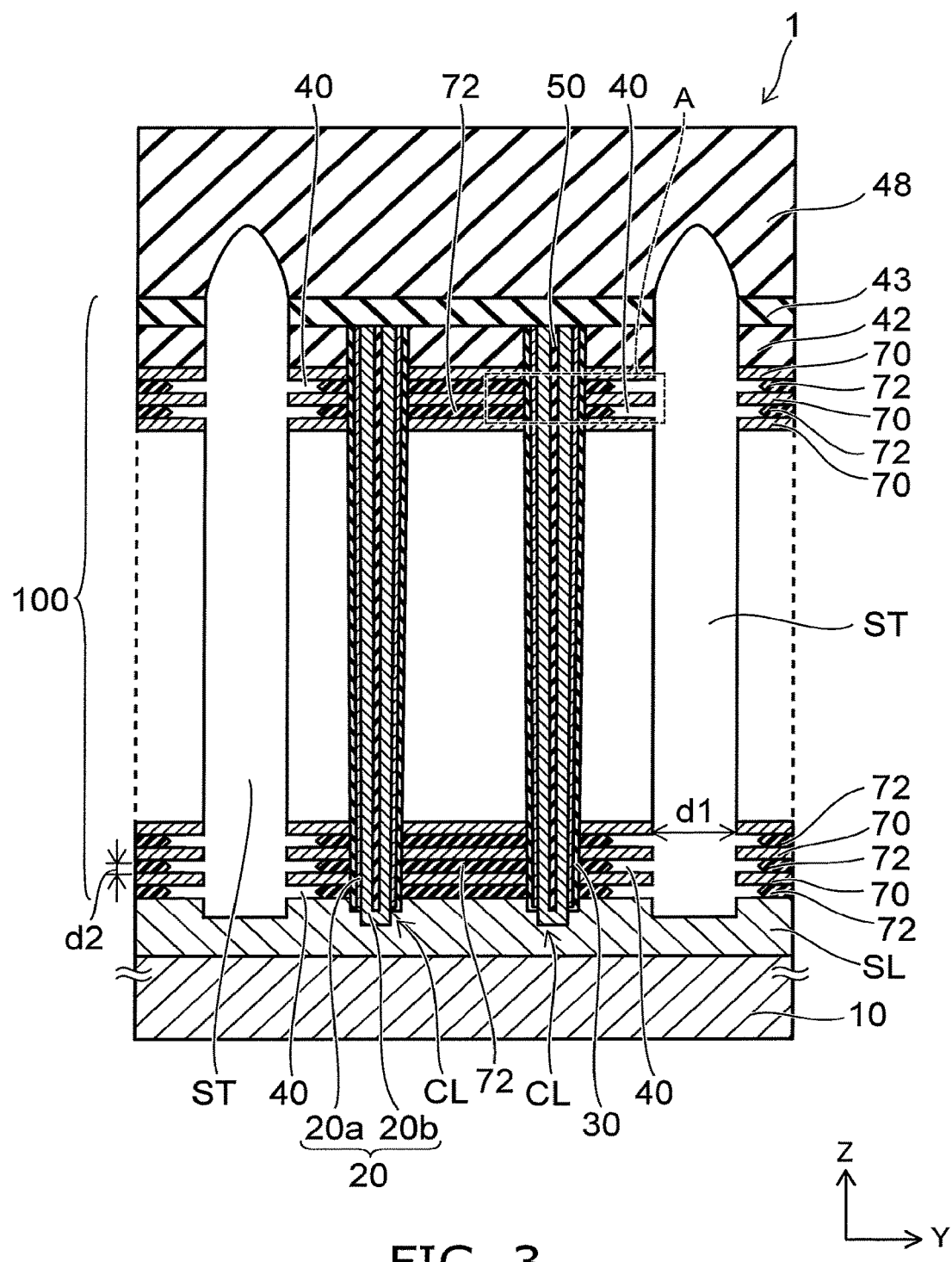
FIG. 3 is an A-A cross-sectional view of FIG. 2.

FIG. 3 is an A-A cross-sectional view of FIG. 2.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction of the other drawings respectively correspond to the X-direction, the Y-direction, and the Z-direction of FIG. 1.

The memory cell array 1 includes the substrate 10, a source layer SL provided above the substrate 10, a stacked body 100 provided on the source layer SL, multiple columnar portions CL, and multiple bit lines BL provided above the stacked body 100.

The substrate 10 is, for example, a silicon substrate. The source layer SL includes a semiconductor layer doped with an impurity and may further include a layer including a metal. An insulating layer may be provided between the substrate 10 and the source layer SL.

A slit (a first air gap) ST is formed in the stacked body 100. The slit ST extends in the stacking direction (the Z-direction) and reaches the source layer SL. Further, the slit ST extends in the X-direction, and divides the stacked body 100 into multiple blocks 200 in the Y-direction.

The columnar portions CL are formed in substantially circular columnar configurations extending through the stacked body 100 in the stacking direction (the Z-direction). As shown in FIG. 2, the multiple columnar portions CL in one block 200 subdivided by the slits ST has, for example, a staggered arrangement. Or, the multiple columnar portions CL may be arranged in a square lattice along the X-direction and the Y-direction.

The multiple bit lines BL are, for example, metal films extending in the Y-direction as shown in FIG. 1. The multiple bit lines BL are separated from each other in the X-direction. Upper end portions of semiconductor bodies 20 of the columnar portions CL described below are connected to the bit lines BL via contacts Cb.

As shown in FIG. 3, the stacked body 100 is provided on the source layer SL. The stacked body 100 includes multiple conductive layers 70 stacked in a direction (the Z-direction) perpendicular to the major surface of the substrate 10.

The conductive layer 70 is, for example, a metal layer. The conductive layer 70 is, for example, a tungsten layer including tungsten as a major component, or a molybdenum layer including molybdenum as a major component.

The multiple conductive layers 70 are stacked in the Z-direction with an insulator interposed. The insulator between the conductive layers 70 includes the insulating layer 72 and an air gap (a second air gap) 40. The insulator (the insulating layer 72 and the air gap 40) is provided also between the source layer SL and the conductive layer 70 of the lowermost layer.

An insulating film 42 is provided on the conductive layer 70 of the uppermost layer; and an insulating film 43 is provided on the insulating film 42. The insulating film 43 covers the upper ends of the columnar portions CL. The columnar portions CL pierce the multiple conductive layers 70 and the multiple insulating layers 72, and reach the source layer SL.

Figure 4:
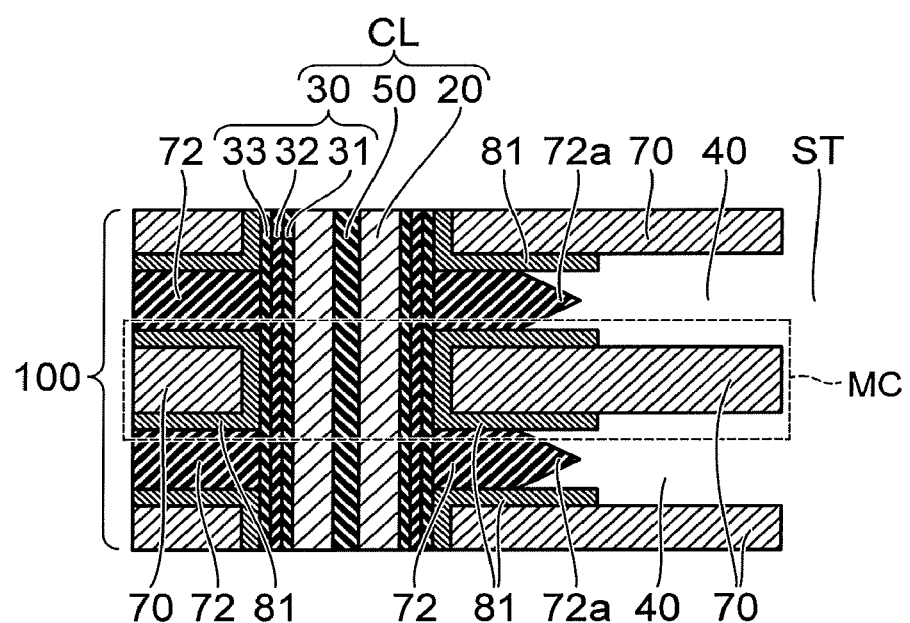
FIG. 4 is an enlarged view of portion A of FIG. 3.

FIG. 4 is an enlarged view of portion A of FIG. 3.

The columnar portion CL includes a memory film 30, the semiconductor body 20, and an insulative core film 50. The semiconductor body 20 is formed in a pipe-like configuration; and the core film 50 is provided on the inner side of the semiconductor body 20. The memory film 30 is provided between the semiconductor body 20 and the conductive layers 70, and surrounds the periphery of the semiconductor body 20.

The semiconductor body 20 is, for example, a silicon film; and the lower end portion of the semiconductor body 20 contacts the source layer SL. The upper end portion of the semiconductor body 20 is connected to the bit line BL via the contact Cb shown in FIG. 1.

The memory film 30 is a stacked film including a tunneling insulating film 31, a charge storage film (a charge storage portion) 32, and a blocking insulating film 33. The blocking insulating film 33, the charge storage film 32, and the tunneling insulating film 31 are provided between the semiconductor body 20 and the conductive layers 70 in order from the conductive layer 70 side.

The semiconductor body 20, the memory film 30, and the conductive layer 70 are included in a memory cell MC. The memory cell MC has a vertical transistor structure in which the conductive layer 70 surrounds the periphery of the semiconductor body 20 with the memory film 30 interposed.

In the memory cell MC having the vertical transistor structure, the semiconductor body 20 functions as a channel; and the conductive layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film, and includes, for example, a silicon nitride film. Or, the charge storage film 32 may be a conductive floating gate surrounded with an insulating body.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the conductive layer 70. Also, the blocking insulating film 33 prevents back-tunneling of the charge from the conductive layer 70 into the columnar portion CL.

The blocking insulating film 33 includes, for example, a silicon oxide film. Or, the blocking insulating film 33 may be, for example, a stacked film of a silicon oxide film and a metal oxide film. In the stacked film, the silicon oxide film is provided between the charge storage film 32 and the metal oxide film; and the metal oxide film is provided between the silicon oxide film and the conductive layer 70.

As shown in FIG. 1, a drain-side selection transistor STD is provided in the upper layer portion of the stacked body 100; and a source-side selection transistor STS is provided in the lower layer portion of the stacked body 100.

It is possible for the conductive layer 70 of at least the uppermost layer of the multiple conductive layers 70 to function as a control gate of the drain-side selection transistor STD; and it is possible for the conductive layer 70 of at least the lowermost layer of the multiple conductive layers 70 to function as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 of the columnar portion CL and are included in one memory string. For example, the memory strings have a staggered arrangement in a planar direction parallel to the XY plane; and the multiple memory cells MC are provided three-dimensionally in the X-direction, the Y-direction, and the Z-direction.

As shown in FIGS. 2 and 3, the insulating layer 72 is provided at the peripheries of the side surfaces of the multiple columnar portions CL, and surrounds the side surfaces of the multiple columnar portions CL. The air gap 40 between the conductive layers 70, and between the conductive layer 70 and the source layer SL is provided between the insulating layer 72 and the slit ST. The air gap 40 communicates with the slit ST. As shown in FIG. 4, the stacked body 100 further includes an intermediate film 81. The intermediate film 81 is provided between the conductive layer 70 and the insulating layer 72, and between the conductive layer 70 and the side surface of the columnar portion CL.

The end of the intermediate film 81 on the slit ST side is recessed from the end of the conductive layer 70 on the slit ST side; and a portion of the upper surface and a portion of the lower surface of the conductive layer 70 are not covered with the intermediate film 81 and are exposed in the air gap 40.

The insulating layer 72 has a protrusion 72a at the end adjacent to the air gap 40. The tip of the protrusion 72a is exposed in the air gap 40. The tip of the protrusion 72a is formed in a sharp configuration or is rounded.

An oblique surface is formed between the tip of the protrusion 72a and the upper surface of the insulating layer 72 (the interface with the intermediate film 81); and an oblique surface is formed between the tip of the protrusion 72a and the lower surface of the insulating layer 72 (the interface with the intermediate film 81). Here, the oblique surface refers to a surface that is tilted with respect to the upper surface and the lower surface of the insulating layer 72.

As shown in FIG. 2, the protrusion 72a of the insulating layer 72 is positioned in the region between the slit ST and the columnar portions CL most proximal to the slit ST of the multiple columnar portions CL disposed in one block 200. The tip of the protrusion 72a extends in the X-direction along the slit ST.

For example, the conductive layer 70 is a tungsten layer or a molybdenum layer; the insulating layer 72 is a silicon oxide layer; and the intermediate film 81 is a titanium nitride film, a titanium film, a tantalum film, or a tantalum nitride film. Or, the intermediate film 81 is a metal oxide film (e.g., an aluminum oxide film). Or, the intermediate film 81 is a silicon oxide film including a higher concentration of an impurity than does the insulating layer 72 (the silicon oxide layer). As described below, the air gap 40 between the conductive layers 70 is formed by removing a portion of the insulating layer 72 by etching through the slit ST.

Subsequently, as shown in FIG. 3, a sealing film (an insulating film) 48 is formed on the insulating film 43; and the upper end of the slit ST is sealed with the sealing film 48. A film formation method such as, for example, CVD (chemical vapor deposition) or the like that has relatively poor coverage is selected as the film formation method of the sealing film 48. Therefore, the sealing film 48 is not filled into the slit ST.

The upper end of the slit ST is plugged in the state in which the air gap (the slit ST) that communicates with the air gap 40 between the conductive layers 70 remains at a position lower than the conductive layer 70 of the uppermost layer. The opening of the air gap 40 on the slit ST side is not covered with the sealing film 48.

In the example shown in FIG. 3, the slit ST pierces the insulating films 42 and 43 higher than the upper surface of the conductive layer 70 of the uppermost layer, and further extends inside the sealing film 48. Or, a portion of the sealing film 48 may enter the slit ST higher than the upper surface of the conductive layer 70 of the uppermost layer so that the opening of the air gap 40 on the slit ST side is not covered with the sealing film 48.

A spacing d1 (the width of the slit ST) between the conductive layers 70 opposing each other with the slit ST interposed in the Y-direction is larger than a spacing d2 (the height of the air gap 40) between the conductive layers 70 adjacent to each other in the Z-direction.

According to the semiconductor device of the embodiment, by using a portion of the region between the conductive layers 70 adjacent to each other in the stacking direction as the air gap 40, the breakdown voltage between the conductive layers 70 can be increased; and the interconnect capacitance can be reduced. By causing the insulating layer 72 to remain in the region between the conductive layers 70, the mechanical strength of the stacked body 100 can be increased.

Here, as a comparative example, in the case where the end surface of the insulating layer 72 adjacent to the air gap 40 is a perpendicular surface along the stacking direction (the Z-direction), the creepage distance along the end surface of the insulating layer 72 between the conductive layers 70 is the spacing between the conductive layers 70.

To increase the memory cell density, it is desirable to increase the number of stacks of the conductive layers 70; and it is desirable to suppress the increase of the thickness of the entire stacked body 100 from the perspective of easily patterning the stacked body 100. Therefore, as the number of stacks of the conductive layers 70 is increased, it may be desirable to reduce the spacing of the conductive layers 70 adjacent to each other in the stacking direction.

In the case of the comparative example recited above, such narrowing of the spacing between the conductive layers 70 shortens the creepage distance along the perpendicular end surface of the insulating layer 72 between the conductive layers 70 and undesirably increases the likelihood of current leakage between the conductive layers 70 due to migration via the end surface of the insulating layer 72, etc.

Conversely, according to the embodiment as shown in FIG. 4, compared to the case of the perpendicular end surface of the comparative example recited above, the creepage distance along the end surface (the surface of protrusion 72a) of the insulating layer 72 between the conductive layers 70 can be increased by forming the protrusion 72a in the end of the insulating layer 72 adjacent to the air gap 40. The creepage distance along the surface of the protrusion 72a of the insulating layer 72 between the conductive layers 70 can be longer than the spacing of the conductive layers 70 adjacent to each other in the stacking direction. Such a structure increases the breakdown voltage between the conductive layers 70 adjacent to each other in the stacking direction.

According to the embodiment, because the slit ST is an air gap and because the end of the air gap 40 on the slit ST side is not plugged with a film, current leakage between the conductive layers 70 via such a film can be prevented.

In the example shown in FIG. 3, the upper end of the slit ST extends higher than the upper surface of the conductive layer 70 of the uppermost layer into the insulating films 42 and 43 and the sealing film 48. The creepage distance along the surface of the insulating films 42 and 43 and the sealing film 48 between the conductive layers 70 of the uppermost layer opposing each other with the slit ST interposed is greater than the width d1 of the slit ST. Such a structure suppresses current leakage between the conductive layers 70 of the uppermost layer opposing each other with the slit ST interposed.

A method for manufacturing the semiconductor device of the embodiment will now be described with reference to FIG. 5 to FIG. 15B.

Figure 5:
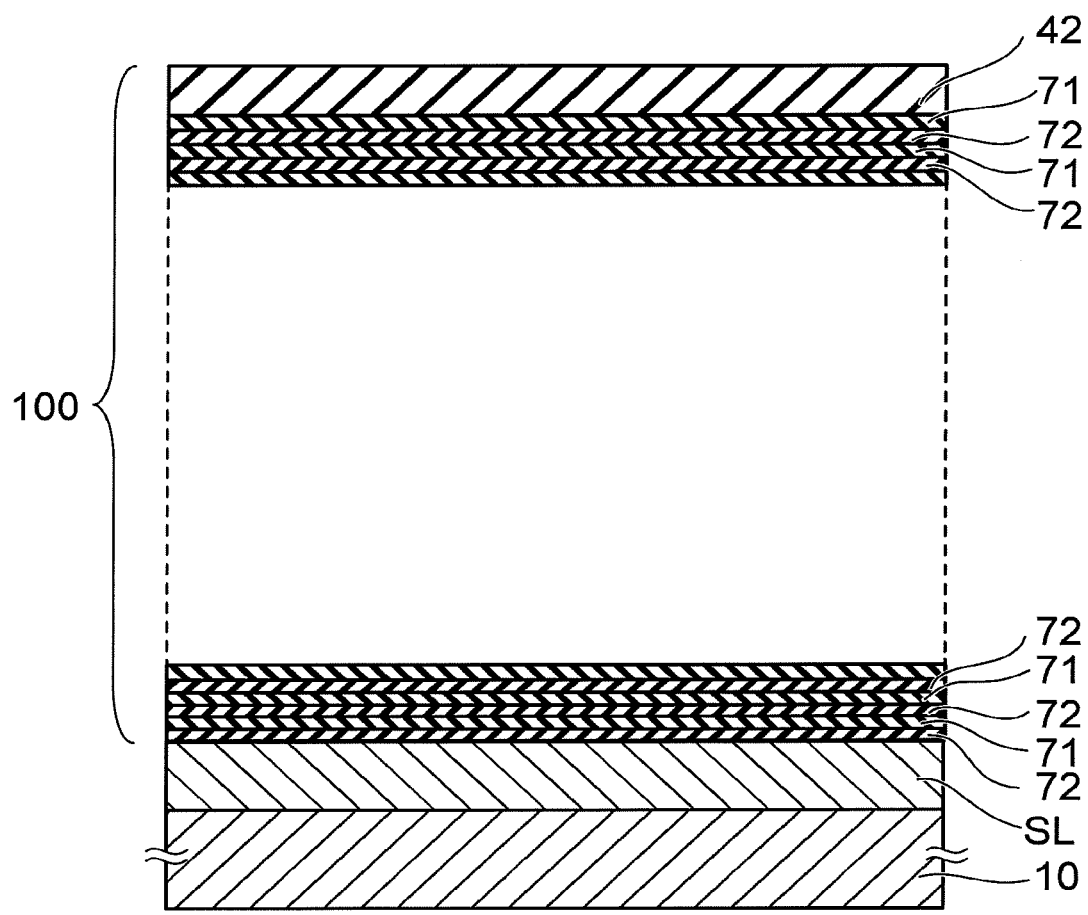
FIG. 5 to FIG. 17B are schematic cross-sectional views showing a method for manufacturing the semiconductor device of the embodiment.

As shown in FIG. 5, the source layer SL is formed above the substrate 10; and the stacked body 100 including the multiple insulating layers 72 and multiple sacrificial layers 71 is formed on the source layer SL. For example, the sacrificial layer 71 is a silicon nitride layer; and the insulating layer 72 is a silicon oxide layer.

The insulating layer 72 is formed on the surface of the source layer SL; and the sacrificial layer 71 is formed on the insulating layer 72. Thereafter, the processes of alternately stacking the insulating layer 72 and the sacrificial layer 71 are repeated. The insulating film 42 is formed on the sacrificial layer 71 of the uppermost layer.

Figure 6:
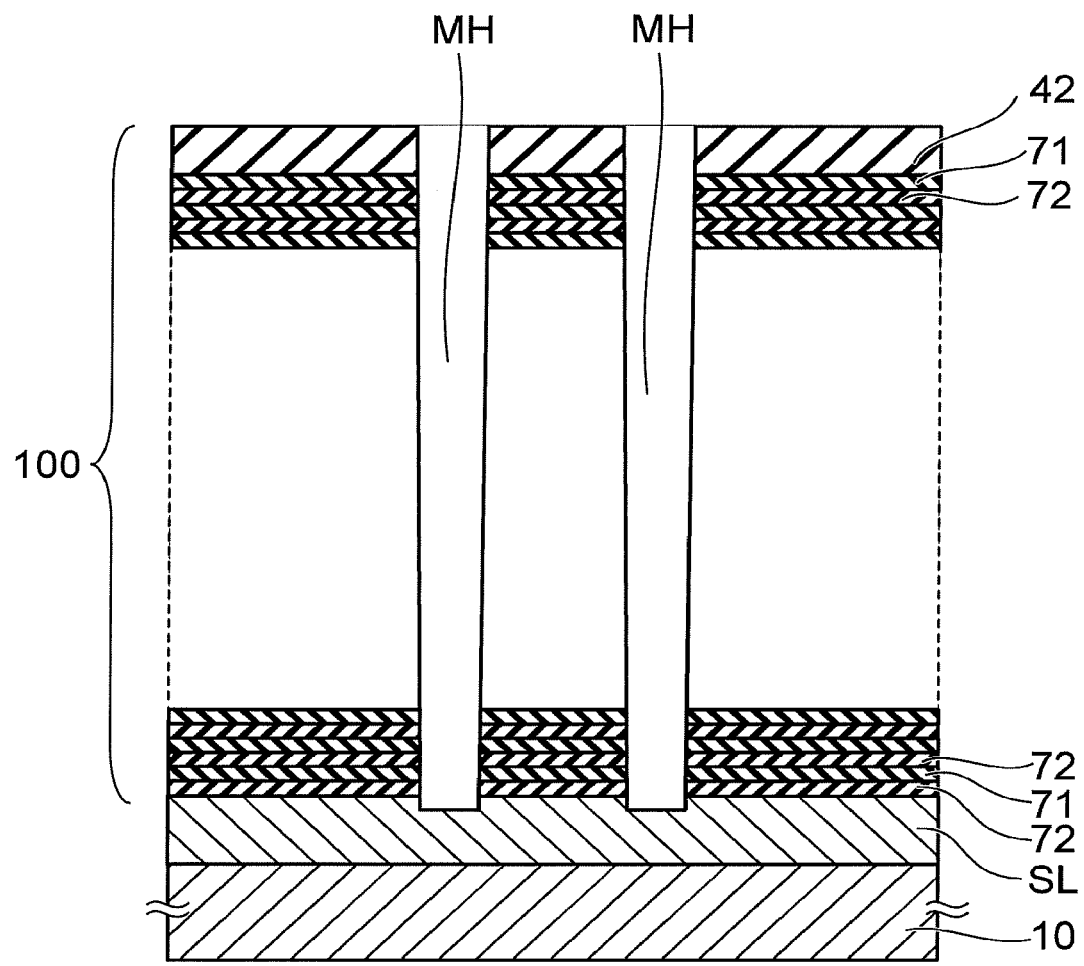

As shown in FIG. 6, multiple memory holes MH are formed in the stacked body 100. The memory holes MH are formed by RIE (reactive ion etching) using a not-illustrated mask. The memory holes MH pierce the stacked body 100 and reach the source layer SL.

Figure 7:
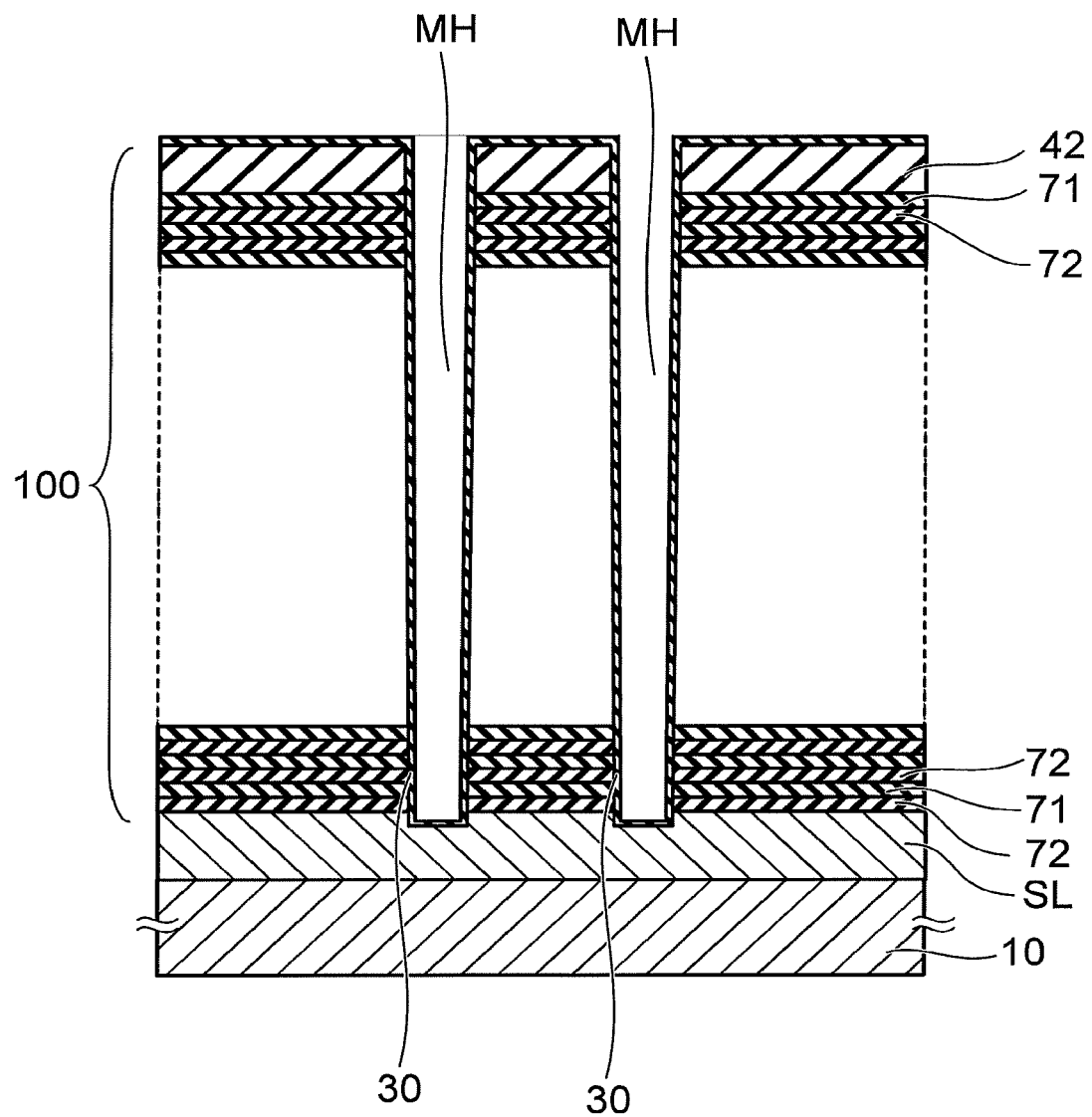
Figure 8:
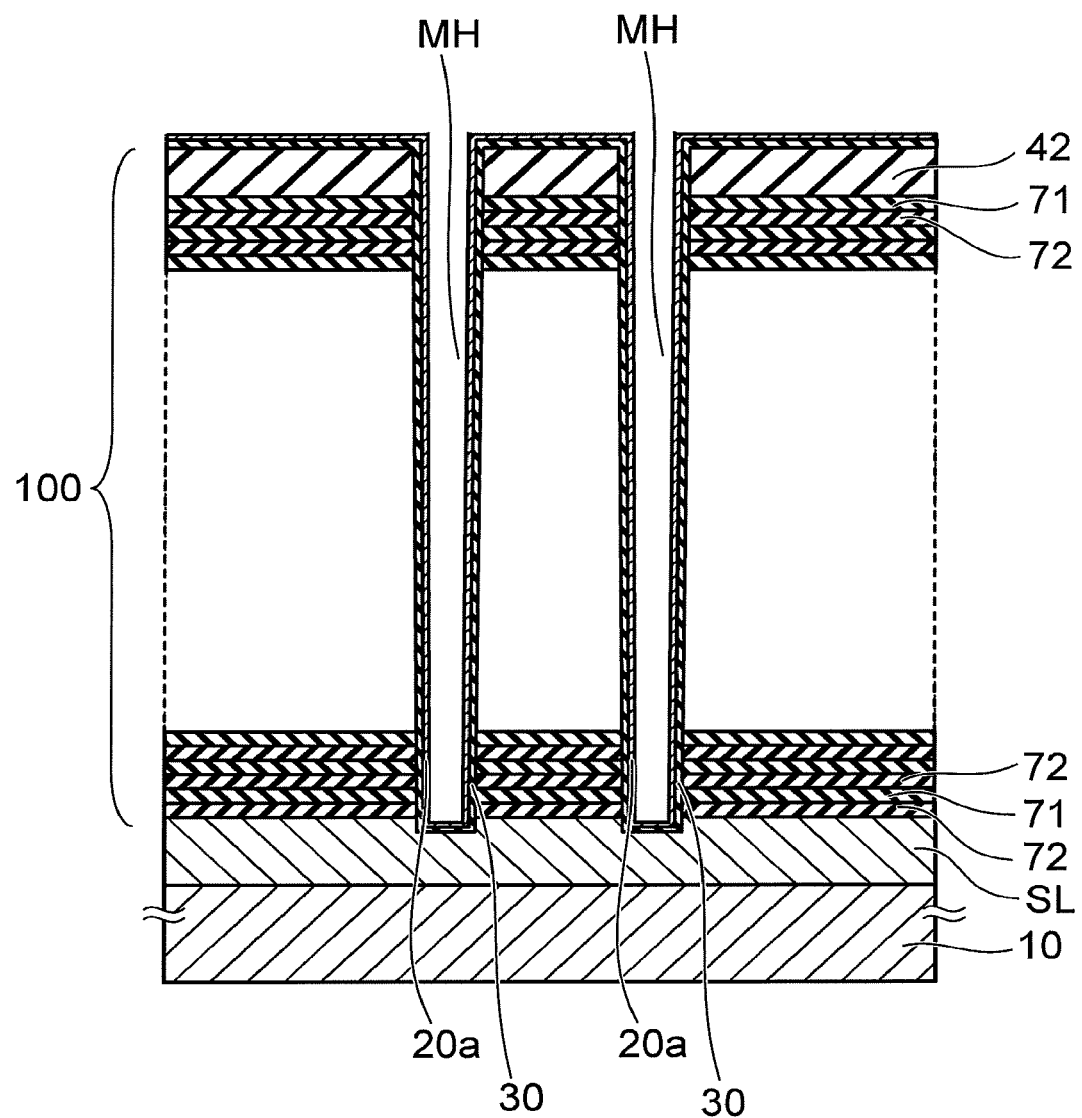

As shown in FIG. 7, the memory film 30 is formed conformally on the side surfaces and the bottom surfaces of the memory holes MH. As shown in FIG. 8, a cover silicon film 20a is formed conformally on the inner side of the memory film 30.

Figure 9:
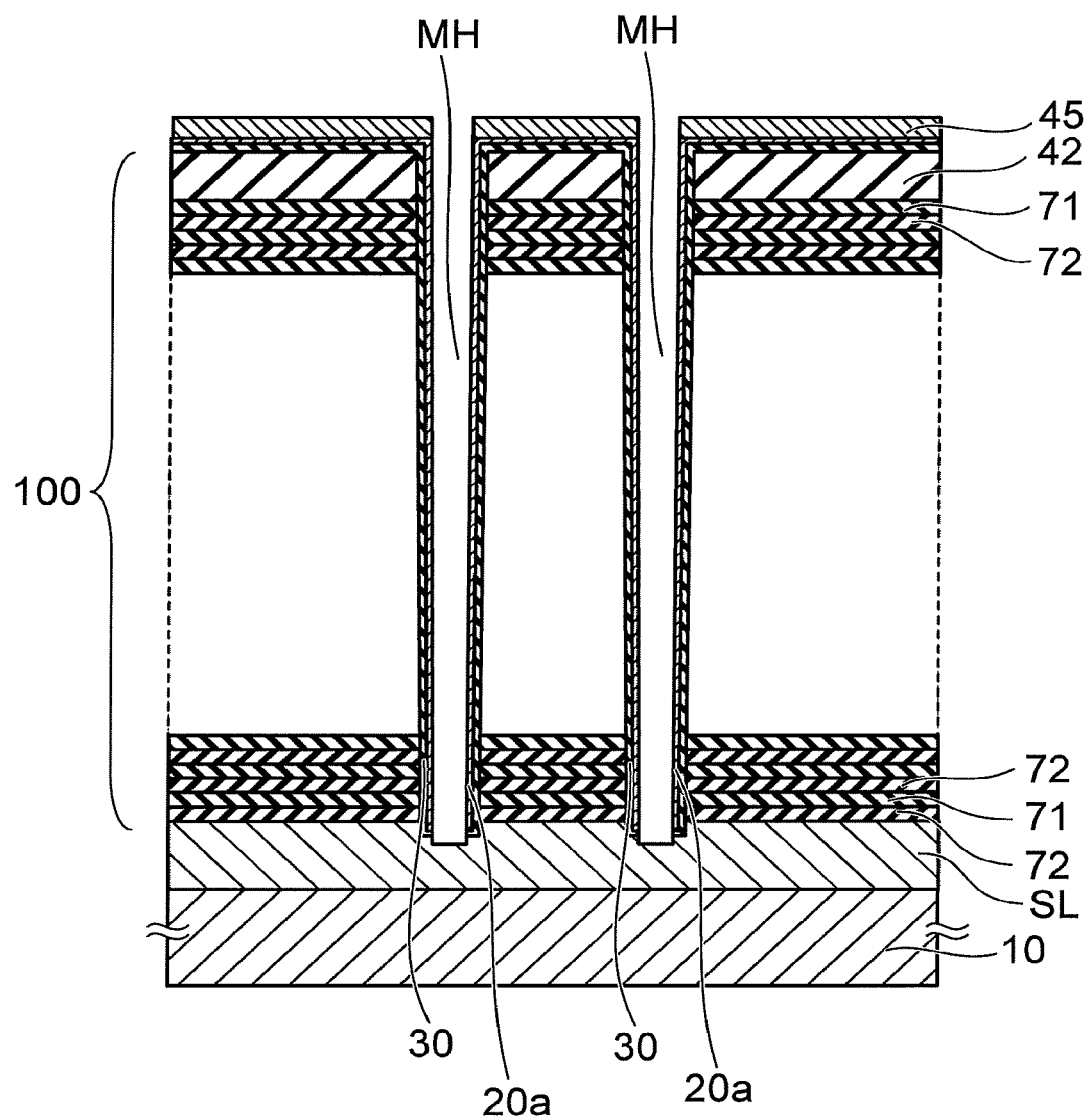

Subsequently, as shown in FIG. 9, a mask layer 45 is formed on the stacked body 100; and the cover silicon film 20a and the memory film 30 that are formed on the bottom surfaces of the memory holes MH are removed by RIE. In the RIE, the memory film 30 formed on the side surfaces of the memory holes MH is protected by being covered with the cover silicon film 20a. The memory film 30 formed on the side surfaces of the memory holes MH is not damaged by the RIE.

Figure 10:
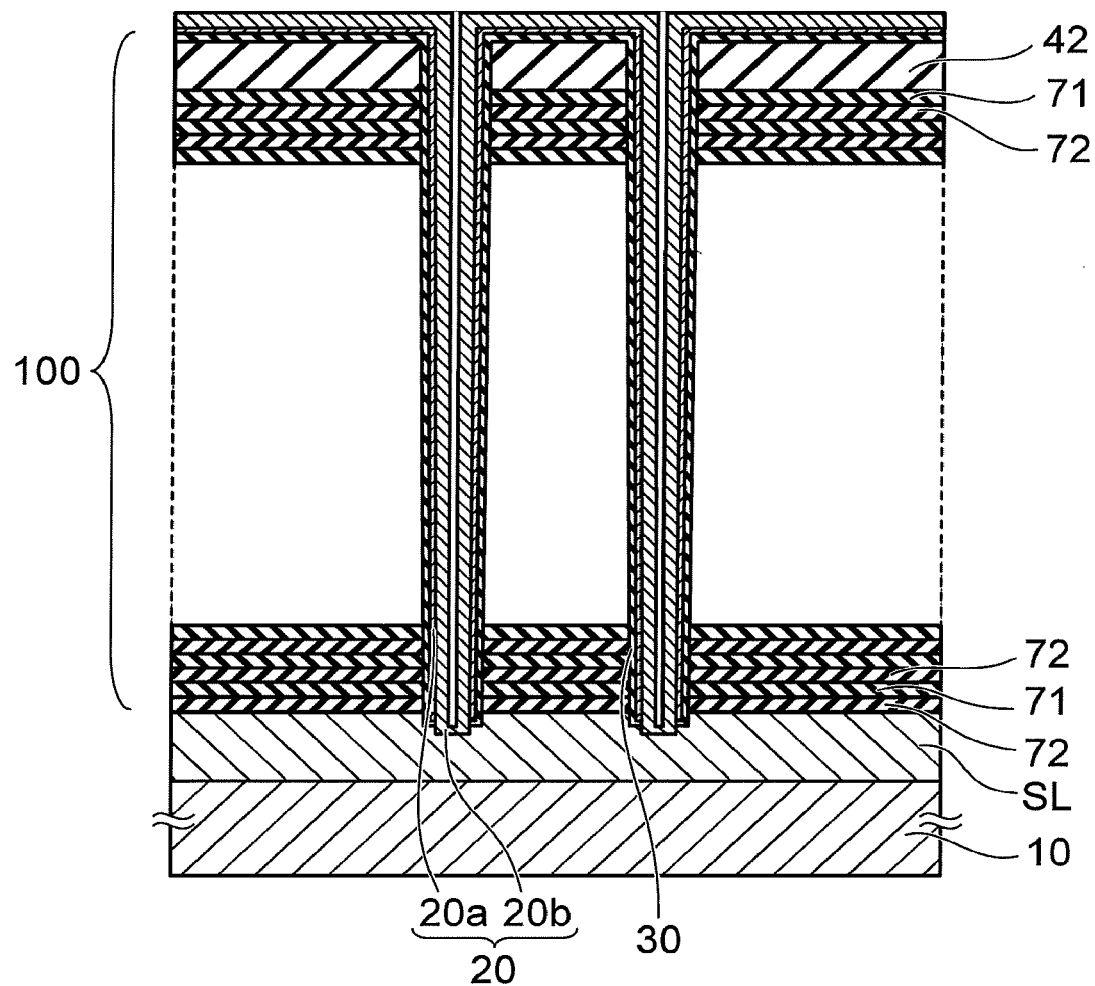

After removing the mask layer 45, a semiconductor film (a silicon film) 20b is formed inside the memory holes MH as shown in FIG. 10. The semiconductor film 20b is formed on the side surface of the cover silicon film 20a and the bottom surfaces of the memory holes MH where the source layer SL is exposed.

For example, the cover silicon film 20a and the semiconductor film 20b are formed as amorphous silicon films and subsequently crystallized into polycrystalline silicon films by heat treatment. The cover silicon film 20a and the semiconductor film 20b are included in the semiconductor body 20 described above.

Figure 11:
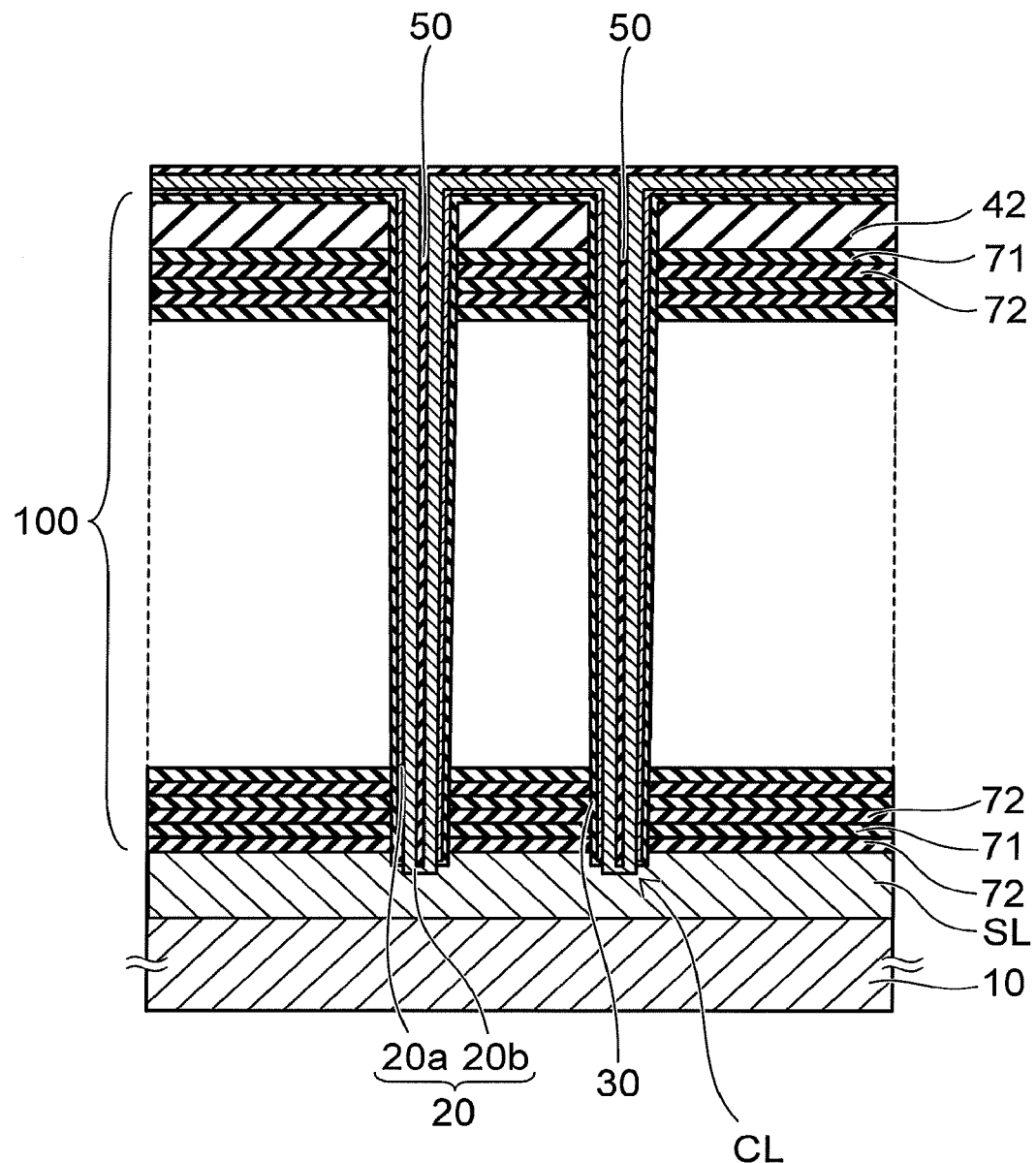

As shown in FIG. 11, the core film 50 is formed on the inner side of the semiconductor film 20b. Thus, the columnar portion CL including the memory film 30, the semiconductor body 20, and the core film 50 is formed.

The films deposited on the insulating film 42 shown in FIG. 11 are removed by CMP (chemical mechanical polishing) or etch-back.

Figure 12:
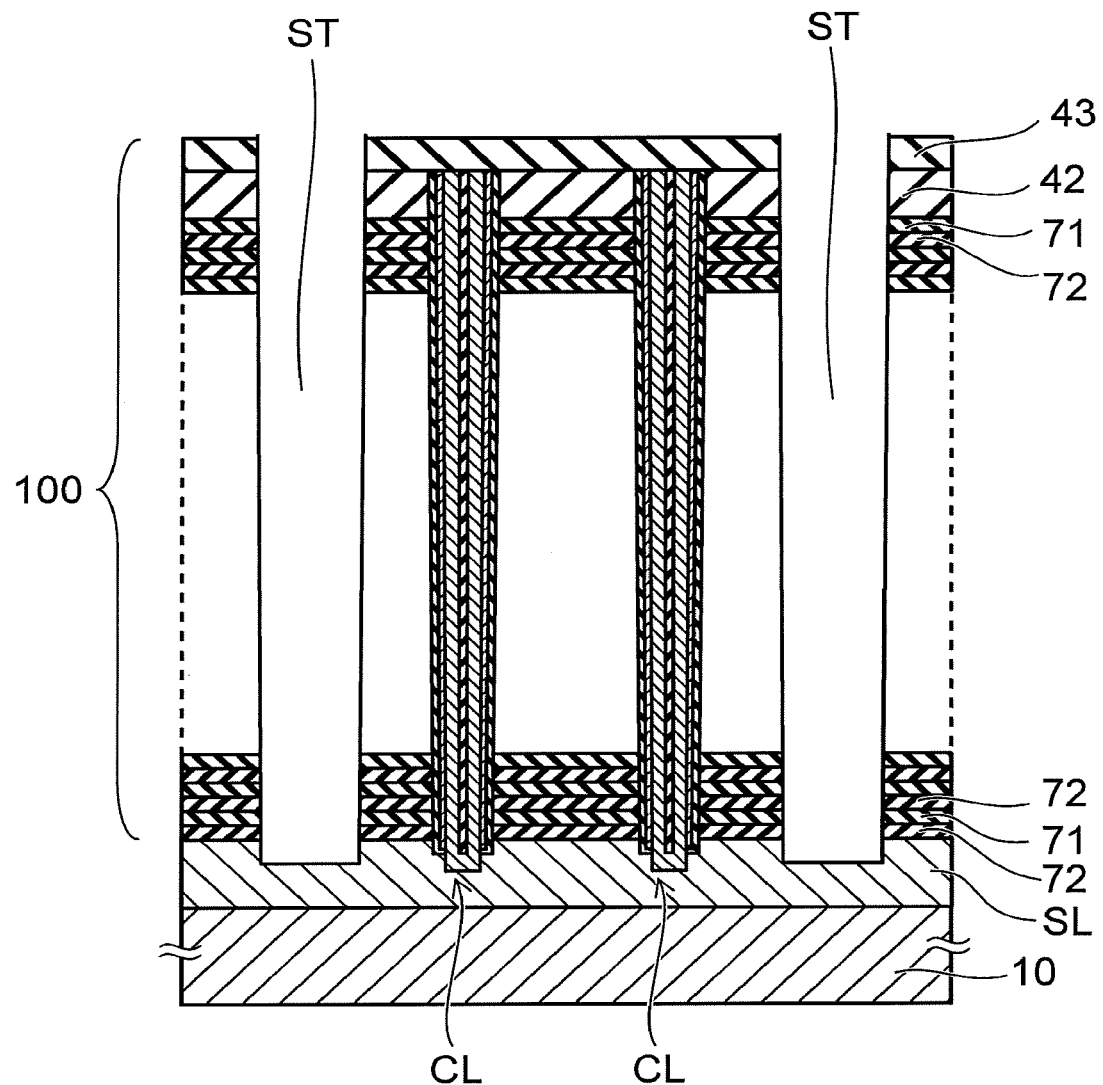

Subsequently, as shown in FIG. 12, the insulating film 43 is formed on the insulating film 42. The insulating film 43 covers the upper ends of the columnar portions CL. Then, the multiple slits ST are formed in the stacked body 100 including the insulating film 43, the insulating film 42, the multiple sacrificial layers 71, and the multiple insulating layers 72 by RIE using a not-illustrated mask. The slits ST pierce the stacked body 100 and reach the source layer SL.

Figure 13:
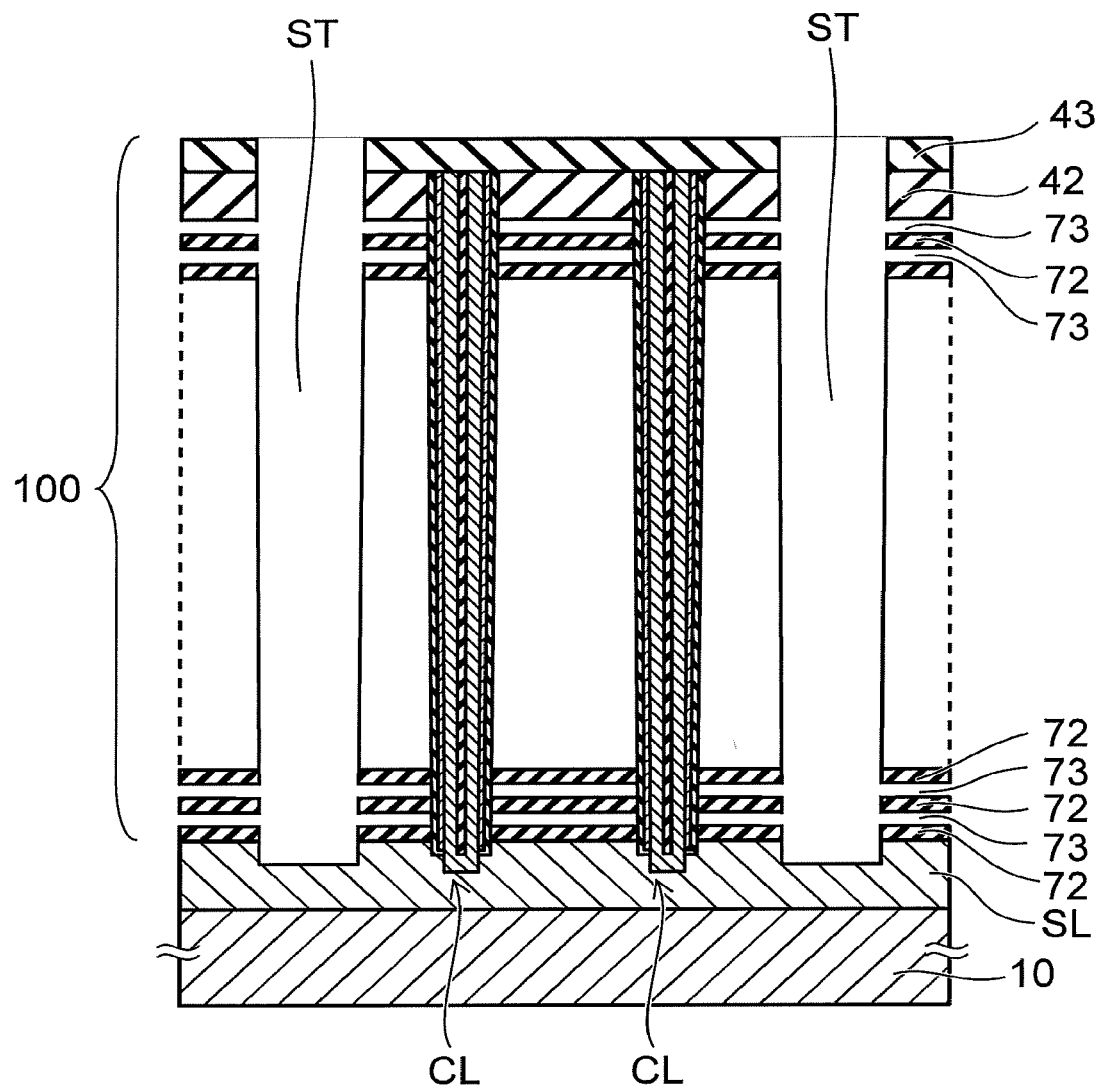

Then, the sacrificial layers 71 are removed by an etching gas or an etchant supplied through the slits ST. For example, the sacrificial layers 71 which are silicon nitride layers are removed using a solution including phosphoric acid. The sacrificial layers 71 are removed; and an air gap 73 is formed between the insulating layers 72 adjacent to each other in the stacking direction as shown in FIG. 13. The air gap 73 is formed also between the insulating film 42 and the insulating layer 72 of the uppermost layer.

The multiple insulating layers 72 contact the side surfaces of the multiple columnar portions CL to surround the side surfaces of the multiple columnar portions CL. The multiple insulating layers 72 are supported by such a physical bond with the multiple columnar portions CL; and the air gap 73 is maintained.

Figure 14A:
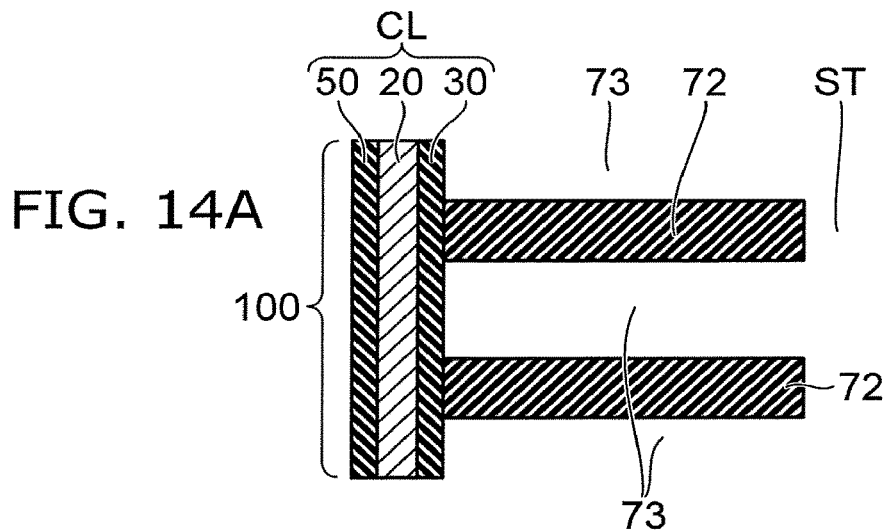
Figure 14B:
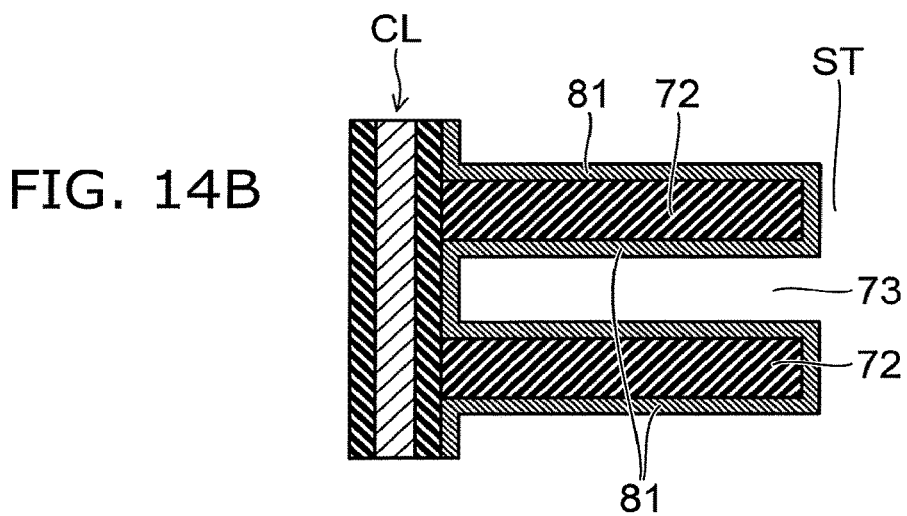

FIG. 14A is an enlarged view of one portion of the slit ST vicinity of the stacked body 100 shown in FIG. 13. After forming the air gap 73 between the insulating layers 72, the intermediate film 81 is formed on the inner wall of the air gap 73 as shown in FIG. 14B.

The intermediate film 81 is formed conformally on the upper surface and the lower surface of the insulating layer 72, the end surface of the insulating layer 72 on the slit ST side, and the side surface of the columnar portion CL. For example, a titanium nitride film is formed by CVD as the intermediate film 81; and the film formation gas is supplied to the air gap 73 through the slit ST.

Figure 14C:
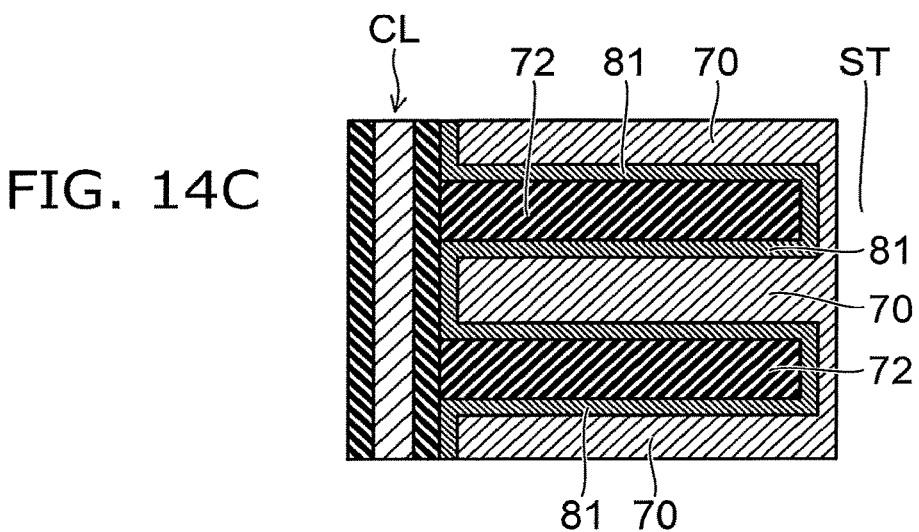

After forming the intermediate film 81, the conductive layer 70 is formed inside the air gap 73 as shown in FIG. 14C. For example, a tungsten layer is formed by CVD as the conductive layer 70; and the film formation gas is supplied to the air gap 73 through the slit ST.

The conductive layer 70 fills the air gap 73 and is formed also on the side wall of the slit ST. The intermediate film 81 is provided between the conductive layer 70 and the insulating layer 72, and between the conductive layer 70 and the side surface of the columnar portion CL.

Subsequently, the conductive layer 70 formed on the side wall of the slit ST is removed; and the conductive layers 70 of the different layers are physically separated from each other. Also, the intermediate film 81 is exposed to the slit ST by the removal of the conductive layer 70 on the side wall of the slit ST.

Figure 15A:
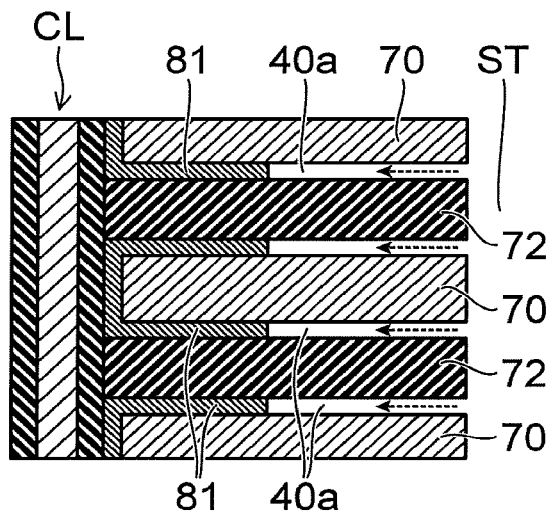
Figure 15B:
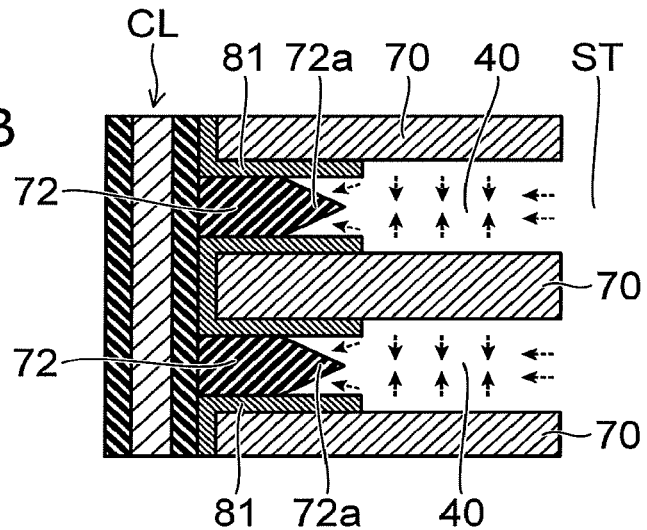

Then, the intermediate film 81 which is a titanium nitride film is selectively etched using a solution including phosphoric acid that is heated to, for example, about 160° C. (a hot phosphoric acid solution) and supplied through the slit ST; and the end of the intermediate film 81 on the slit ST side is caused to recede in the direction away from the slit ST as shown in FIG. 15A.

The conductive layer 70 which is a tungsten layer and the insulating layer 72 which is a silicon oxide layer have etching resistance to the hot phosphoric acid solution. Or, it is also possible to selectively etch the intermediate film 81 which is the titanium nitride film by using a solution including aqueous hydrogen peroxide.

Because the end of the intermediate film 81 is recessed from the end of the conductive layer 70 and the end of the insulating layer 72, a space (or a nanoslit) 40a that communicates with the slit ST is formed between the conductive layer 70 and the insulating layer 72. The height of the space 40a corresponds to the film thickness of the intermediate film 81, and is not less than several nm, and not more than several tens of nm.

After forming the space 40a, the insulating layer 72 is etched using a solution including hydrofluoric acid (e.g., a dilute hydrofluoric acid solution or a buffered hydrofluoric acid solution) supplied through the slit ST and the space 40a.

The etching of the insulating layer 72 progresses not only from the end exposed in the slit ST but also from the surfaces (the upper surface and the lower surface) exposed in the space 40a. Accordingly, the end of the insulating layer 72 recedes while being isotropically etched from the directions of the arrows schematically shown in FIG. 15B.

The end of the insulating layer 72 is caused to have a protruding configuration by appropriately adjusting the height, the length, the volume of the space 40a, and the etching conditions (the time, the type of the solution, etc.) of the insulating layer 72. The air gap 40 that communicates with the slit ST between the conductive layers 70 adjacent to each other in the stacking direction is formed by the recession of the insulating layer 72. The protrusion 72a is formed in the end of the insulating layer 72 adjacent to the air gap 40.

The side surface of the columnar portion CL is not exposed to the etchant when causing the insulating layer 72 to recede. The side surface of the columnar portion CL is not etched and is not damaged by the etching. Therefore, the recessed position of the end of the insulating layer 72 is positioned further on the slit ST side than is the columnar portion CL of the multiple columnar portions CL most proximal to the slit ST as shown in FIG. 2.

After forming the air gap 40 by causing the insulating layer 72 to recede, the upper end of the slit ST is sealed with the sealing film 48 as shown in FIG. 3 while maintaining the state in which the air gap 40 communicates with the slit ST. For example, a silicon oxide film is formed by CVD as the sealing film 48.

Figure 16A:
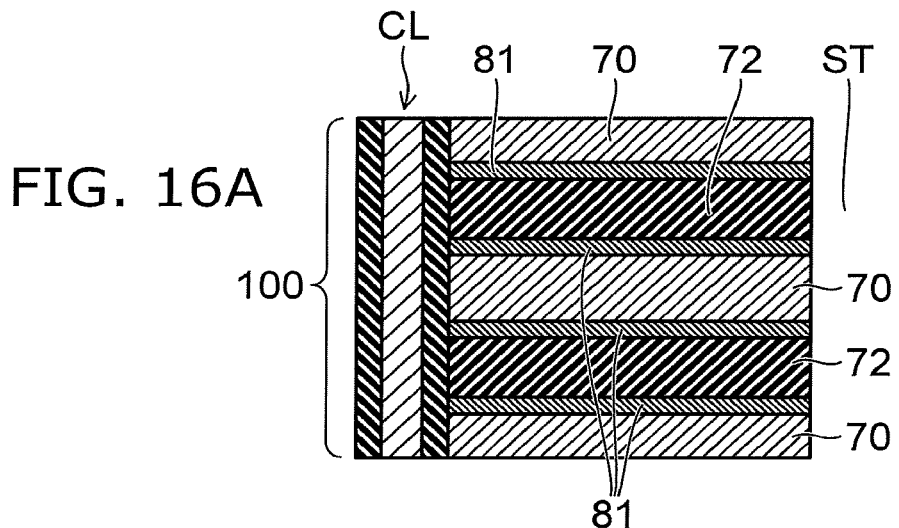

Although the sacrificial layers 71 are replaced with the conductive layers 70 in the example described above, the insulating layers 72 and the conductive layers 70 may be stacked alternately when forming the stacked body 100. In such a case, the intermediate film 81 may be formed between the insulating layers 72 and the conductive layers 70 when forming the stacked body 100 as shown in FIG. 16A. The intermediate film 81 is not interposed between the side surface of the columnar portion CL and the conductive layers 70.

Figure 16B:
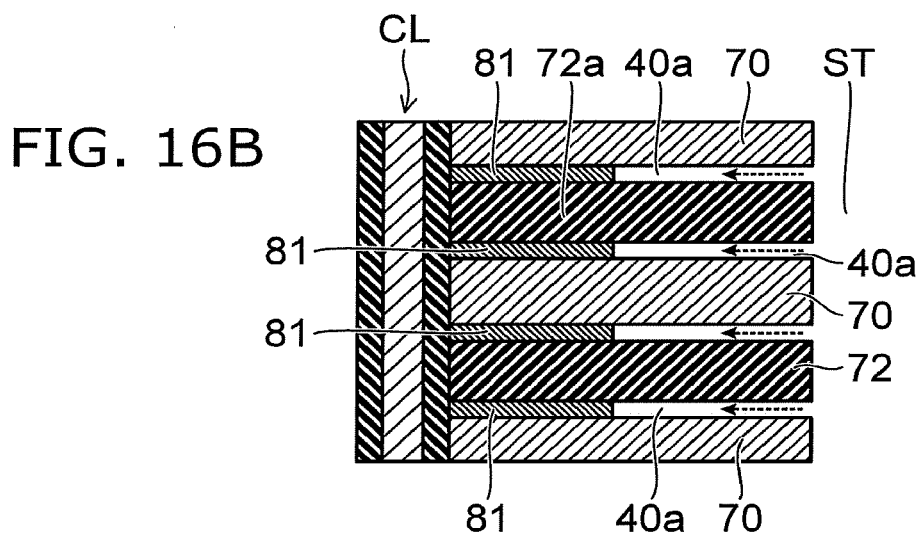

Then, after forming the slit ST, the space 40a is formed between the conductive layer 70 and the insulating layer 72 by causing the intermediate film 81 to recede by etching through the slit ST as shown in FIG. 16B.

Figure 16C:
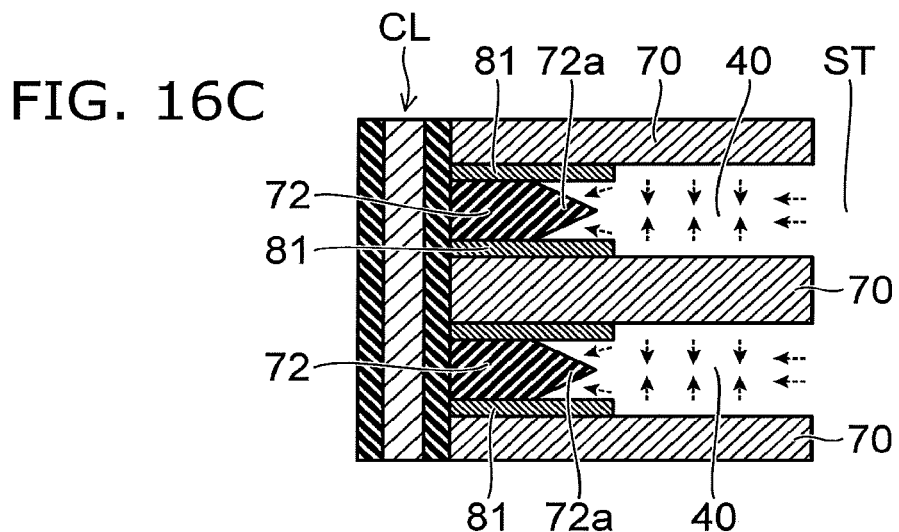

Subsequently, the insulating layer 72 is etched using a solution including hydrofluoric acid supplied through the slit ST and the space 40a. The etching of the insulating layer 72 progresses not only from the end exposed in the slit ST but also from the surfaces (the upper surface and the lower surface) exposed in the space 40a. The end of the insulating layer 72 recedes while being formed in a protruding configuration by being etched isotropically from the directions of the arrows schematically shown in FIG. 16C.

The air gap 40 communicating with the slit ST between the conductive layers 70 adjacent to each other in the stacking direction is formed by the recession of the insulating layer 72. The protrusion 72a is formed in the end of the insulating layer 72 adjacent to the air gap 40.

A metal oxide film may be used as the intermediate film 81. For example, an aluminum oxide film can be caused to recede by etching that is selective with respect to the conductive layer 70 which is a tungsten layer and the insulating layer 72 which is a silicon oxide layer by using a solution including an oxidative solvent.

Also, a silicon oxide film including a higher concentration of an impurity than does the insulating layer 72 which is the silicon oxide layer may be used as the intermediate film 81. In such a case, the insulating layer 72 and the intermediate film are etched simultaneously using a solution including hydrofluoric acid. In the etching, it is possible for the recess rate of the intermediate film 81 including an impurity (e.g., boron, phosphorus, etc.) to be faster than the recess rate of the insulating layer 72; and the space can be formed between the conductive layer 70 and the insulating layer 72 by causing the intermediate film 81 end to recede faster than the end of the insulating layer 72.

Accordingly, the etching of the insulating layer 72 progresses not only from the end exposed in the slit ST but also from the surfaces (the upper surface and the lower surface) exposed in the space between the conductive layer 70 and the insulating layer 72; the end of the insulating layer 72 is etched isotropically similarly to the example described above; and the end of the insulating layer 72 recedes while being formed in a protruding configuration. The air gap 40 communicating with the slit ST between the conductive layers 70 adjacent to each other in the stacking direction is formed by the recession of the insulating layer 72. The protrusion 72a is formed in the end of the insulating layer 72 adjacent to the air gap 40.

Figure 17A:
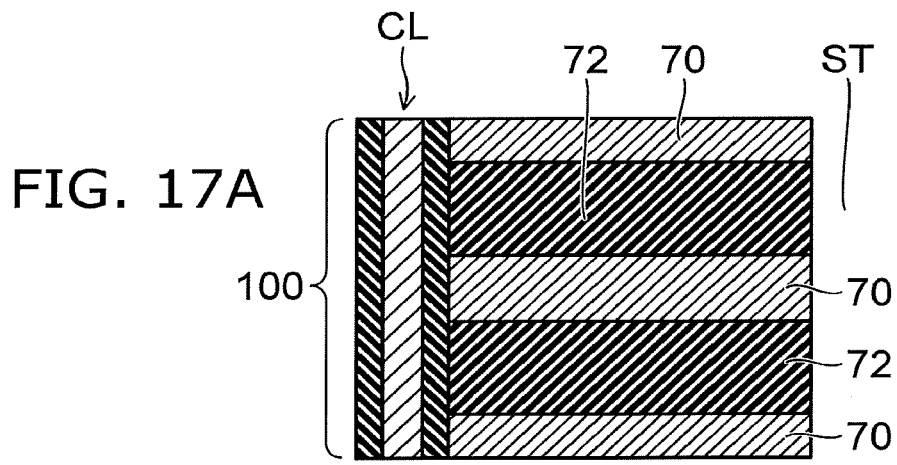

As shown in FIG. 17A, by forming the insulating layer 72 to include an impurity having a concentration difference (a gradient) in the thickness direction, the end of the insulating layer 72 can be caused to recede while being formed in a protruding configuration without providing the intermediate film.

By setting the impurity concentration of the upper surface-side region and the impurity concentration of the lower surface-side region of the insulating layer 72 to be higher or lower than the impurity concentration of the middle region between the upper surface-side region and the lower surface-side region, the etching rates of the upper surface-side region and the lower surface-side region of the insulating layer 72 can be faster than the etching rate of the middle region when causing the insulating layer 72 to recede.

For example, as shown in FIG. 5 described above, in the case where the sacrificial layer 71 which is a silicon nitride layer and the insulating layer 72 which is a silicon oxide layer are stacked alternately, nitrogen can be caused to segregate at the vicinity of the boundary (the upper surface-side region and the lower surface-side region) between the insulating layer 72 and the sacrificial layer 71. The nitrogen concentration of the upper surface-side region and the nitrogen concentration of the lower surface-side region of the insulating layer 72 can be set to be higher than the nitrogen concentration of the middle region.

As a method for such a film property modulation in the thickness direction of the insulating layer 72, for example, the surface of the insulating layer 72 may be nitrided intentionally after forming the insulating layer 72. Or, a region where nitrogen segregates (or SiON) can be formed at the interface between the insulating layer 72 and the sacrificial layer 71 by increasing a gas including nitrogen in the film formation of the insulating layer 72.

Also, the surface of the sacrificial layer 71 may be oxidized intentionally after forming the sacrificial layer 71. Or, a region where nitrogen segregates (or SiON) may be formed at the interface between the insulating layer 72 and the sacrificial layer 71 by increasing a gas including oxygen in the film formation of the sacrificial layer 71.

Figure 17B:
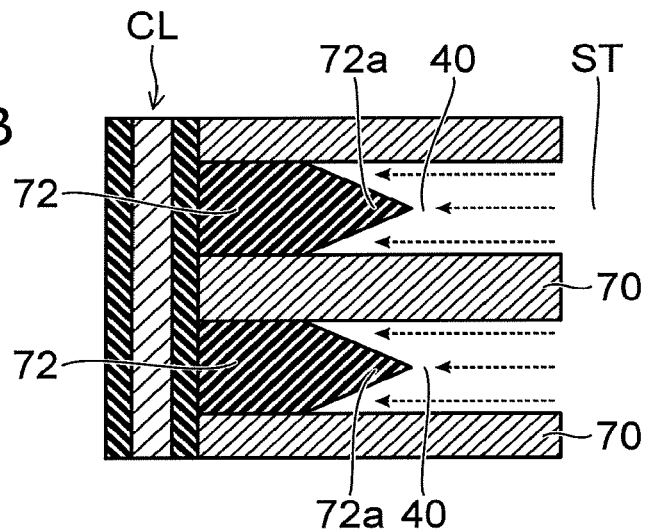

Subsequently, as shown in FIG. 17A, the sacrificial layers 71 are replaced with the conductive layers (the tungsten layers) 70 through the slit ST. Then, by etching the end of the insulating layer 72 from the slit ST side by using an appropriate etchant, the upper surface-side region and the lower surface-side region of the insulating layer 72 can be caused to recede faster than the middle region as shown in FIG. 17B. The end of the insulating layer 72 recedes while being formed in a protruding configuration; the air gap 40 communicating with the slit ST between the conductive layers 70 adjacent to each other in the stacking direction is formed; and the protrusion 72a is formed in the end of the insulating layer 72 adjacent to the air gap 40.

Other than boron, phosphorus, and nitrogen described above, an etching rate difference may be caused similarly between the regions of the insulating layer 72 by the insulating layer 72 including, for example, carbon or hydrogen as the impurity having the concentration difference in the thickness direction. In such a case, the impurity element may be included in the insulating layer 72 in a state of being bonded to another element. For example, an element of nitrogen, carbon, or hydrogen may be included in the insulating layer 72 in the form of a molecule such as $H_2O$ (water) or a group such as $-NH_2$, $-CH_3$, $-OH$, etc., bonded to Si.

Figure 18:
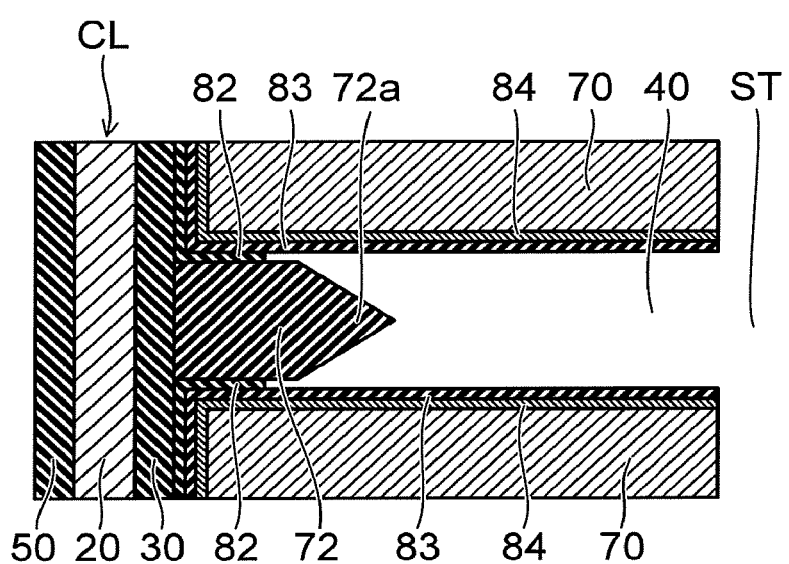
FIG. 18 is a schematic cross-sectional view of the semiconductor device of the embodiment.

FIG. 18 is a schematic cross-sectional view showing another structure example of one portion of the slit ST vicinity of the stacked body 100.

The air gap 73 is formed between the insulating layers 72 in the process shown in FIG. 14A described above; subsequently, an intermediate film 82, a metal oxide film 83, and a titanium nitride film 84 are formed in order on the inner wall of the air gap 73. Subsequently, the conductive layer (the tungsten layer) 70 is formed inside the remaining air gap 73.

The intermediate film 82 is a silicon oxide film including a higher concentration of an impurity than does the insulating layer 72 which is a silicon oxide layer. The metal oxide film 83 is an aluminum oxide film.

The stacked film of the intermediate film 82, the metal oxide film 83, and the titanium nitride film 84 is interposed between the conductive layer 70 and the insulating layer 72, and between the conductive layer 70 and the side surface of the columnar portion CL.

The intermediate film 82 is provided between the conductive layer 70 and the charge storage film 32 or the blocking insulating film 33 of the columnar portion CL described above; the metal oxide film 83 is provided between the intermediate film 82 and the conductive layer 70; and the titanium nitride film 84 is provided between the metal oxide film 83 and the conductive layer 70.

The intermediate film (the silicon oxide film) 82 and the metal oxide film 83 between the conductive layer 70 and the side surface of the columnar portion CL may function as a blocking insulating film. The titanium nitride film 84 may function as an adhesion layer or a barrier metal.

After forming the conductive layer 70 in the air gap 73 recited above, for example, the insulating layer 72 and the intermediate film 82 are etched simultaneously by using a solution including hydrofluoric acid. In the etching, it is possible for the recess rate of the intermediate film 82 including an impurity (e.g., boron, phosphorus, etc.) to be faster than the recess rate of the insulating layer 72; the intermediate film 82 end recedes faster than the end of the insulating layer 72; and a space can be formed between the conductive layer 70 and the insulating layer 72. The metal oxide film 83, the titanium nitride film 84, and the conductive layer 70 have resistance to the etching.

The etching of the insulating layer 72 progresses not only from the end exposed in the slit ST but also from the surfaces (the upper surface and the lower surface) exposed in the space between the conductive layer 70 and the insulating layer 72 recited above; the end of the insulating layer 72 is etched isotropically similarly to the example described above; and the end of the insulating layer 72 recedes while being formed in the protruding configuration. The air gap 40 communicating with the slit ST between the conductive layers 70 adjacent to each other in the stacking direction is formed by the recession of the insulating layer 72. The protrusion 72a is formed in the end of the insulating layer 72 adjacent to the air gap 40.

The surfaces of the conductive layer 70 facing the air gap 40 are covered with the metal oxide film 83 which is an insulating film.

Figure 19A:
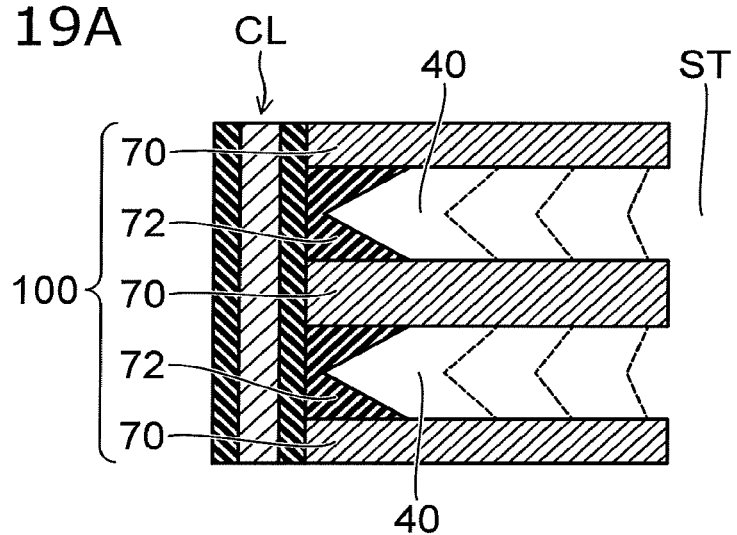
FIGS. 19A and 19B are schematic cross-sectional views of the semiconductor device of the embodiment.
Figure 19B:
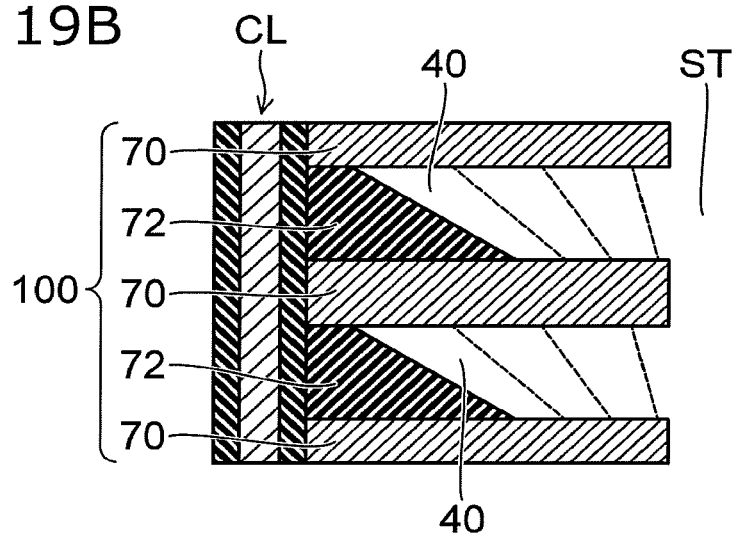

FIG. 19A and FIG. 19B are schematic cross-sectional views showing other structure examples of the end of the insulating layer 72.

FIG. 19A shows an example in which the end of the insulating layer 72 adjacent to the air gap 40 has a sideways V-shaped configuration having its bottom on the columnar portion CL side. FIG. 19B shows an example in which the end of the insulating layer 72 adjacent to the air gap 40 is an oblique surface approaching the columnar portion CL upward in the stacking direction of the stacked body 100. This structure may be a structure in which the end of the insulating layer 72 adjacent to the air gap 40 is an oblique surface approaching the columnar portion CL downward in the stacking direction of the stacked body 100.

In either case of FIG. 19A or FIG. 19B, the insulating layer 72 has a surface tilted with respect to the stacking direction of the stacked body 100 at the end adjacent to the air gap 40.

The insulating layer 72 includes an impurity (e.g., boron, phosphorus, nitrogen, carbon, hydrogen, etc.) and has a concentration difference of the impurity in the thickness direction of the insulating layer 72. An etching rate difference can be provided by an impurity concentration difference (a film property modulation) in the thickness direction of the insulating layer 72 similar to that of the example of FIGS. 17A and 17B described above. In FIGS. 19A and 19B, the transition of the shape change of the end surface of the insulating layer 72 as the end surface recedes due to the etching is illustrated schematically by the broken lines.

In the example shown in FIG. 19A, the middle region of the insulating layer 72 is caused to recede faster than the upper surface-side region and the lower surface-side region.

In the example shown in FIG. 19B, the etching rate is controlled to increase gradually from the lower surface side to the upper surface side of the insulating layer 72. Or, the etching rate may be increased gradually from the upper surface side to the lower surface side of the insulating layer 72.

Compared to the case where the end of the insulating layer 72 is a perpendicular end surface along the stacking direction, in such a structure in which the end of the insulating layer 72 is a sideways V-shaped configuration or an oblique surface, the creepage distance along the end surface of the insulating layer 72 between the conductive layers 70 adjacent to each other in the stacking direction can be long; and the breakdown voltage between the conductive layers 70 is increased.

The side surface of the columnar portion CL is not exposed to the etchant or the etching gas when causing the end of the insulating layer 72 to recede. For such a constraint, to realize the same creepage distance in a region that is a substantially constant distance from the columnar portion CL, the volume of the air gap 40 between the conductive layers 70 adjacent to each other in the stacking direction can be larger for the protruding configuration and the sideways V-shaped configuration of the end of the insulating layer 72 than for the oblique surface shown in FIG. 19B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    a stacked body including a plurality of conductive layers stacked with an insulator interposed;
    a columnar portion extending through the stacked body in a stacking direction of the stacked body; and
    a first air gap extending through the stacked body in the stacking direction,
    the insulator including
        an insulating layer provided at a periphery of a side surface of the columnar portion, and
        a second air gap communicating with the first air gap and being provided between the insulating layer and the first air gap,
    the insulating layer having a protrusion at an end adjacent to the second air gap.

2. The device according to claim 1, wherein the stacked body includes an intermediate film provided between one of the conductive layers and the insulating layer.

3. The device according to claim 2, wherein the intermediate film is provided also between one of the conductive layers and the side surface of the columnar portion.

4. The device according to claim 2, wherein
    the conductive layers are tungsten layers or molybdenum layers,
    the insulating layer is a silicon oxide layer, and
    the intermediate film is a titanium nitride film, a titanium film, a tantalum film, or a tantalum nitride film.

5. The device according to claim 2, wherein
    the conductive layers are tungsten layers or molybdenum layers,
    the insulating layer is a silicon oxide layer, and
    the intermediate film is a metal oxide film.

6. The device according to claim 2, wherein
    the conductive layers are tungsten layers or molybdenum layers,
    the insulating layer is a silicon oxide layer, and
    the intermediate film is a silicon oxide film including a higher concentration of an impurity than does the insulating layer.

7. The device according to claim 6, wherein
the silicon oxide film contacts the insulating layer, and
at least one of a metal oxide film, a titanium nitride film, a titanium film, a tantalum film, and a tantalum nitride film is provided between the silicon oxide film and one of the conductive layers.

8. The device according to claim 1, wherein
the insulating layer includes an impurity, and
the insulating layer has a concentration difference of the impurity in a thickness direction of the insulating layer.

9. The device according to claim 1, further comprising a sealing film sealing an upper end of the first air gap.

10. The device according to claim 1, wherein
the first air gap is a slit dividing the stacked body into a plurality of blocks,
a plurality of the columnar portions is disposed in one of the blocks, and
the protrusion of the insulating layer is positioned in a region between the slit and the columnar portion of the plurality of columnar portions most proximal to the slit.

11. A semiconductor device, comprising:
a stacked body including a plurality of conductive layers stacked with an insulator interposed;
a columnar portion extending through the stacked body in a stacking direction of the stacked body; and
a first air gap extending through the stacked body in the stacking direction,
the insulator including
an insulating layer including an impurity and being provided at a periphery of a side surface of the columnar portion, and
a second air gap communicating with the first air gap and being provided between the insulating layer and the first air gap,
the insulating layer having a concentration difference of the impurity in a thickness direction of the insulating layer.

12. The device according to claim 11, wherein the insulating layer has a surface tilted with respect to the stacking direction at an end adjacent to the second air gap.

13. The device according to claim 11, wherein the impurity is at least one type of boron, phosphorus, nitrogen, carbon, and hydrogen.

14. The device according to claim 11, further comprising a sealing film sealing an upper end of the first air gap.

* * * * *